United States Patent [19]
Chen et al.

[11] Patent Number: 5,998,045
[45] Date of Patent: Dec. 7, 1999

[54] POLYMERIC LIGHT-EMITTING DEVICE

[75] Inventors: Weidong Chen, Sunnyvale; Gerrit Klaerner; Robert Dennis Miller, both of San Jose; John Campbell Scott, Los Gatos, all of Calif.

[73] Assignees: International Business Machines Corporation, Armonk, N.Y.; The Board of Trustees of the Leland Stanford Junior University, Stanford, Calif.

[21] Appl. No.: 08/888,172

[22] Filed: Jul. 3, 1997

[51] Int. Cl.$^6$ .................................. H05B 33/13
[52] U.S. Cl. ................. 428/690; 428/691; 428/917; 313/504
[58] Field of Search ................. 428/690, 691, 428/917; 313/504–509

[56] References Cited

U.S. PATENT DOCUMENTS

| | | | |
|---|---|---|---|
| 3,173,050 | 3/1965 | Gurnee | 313/108 |
| 4,209,327 | 6/1980 | Ohta et al. | 430/82 |
| 4,356,429 | 10/1982 | Tang | 313/503 |
| 4,725,513 | 2/1988 | Eguchi et al. | 428/690 |
| 5,085,947 | 2/1992 | Saito et al. | 428/690 |
| 5,317,169 | 5/1994 | Nakano et al. | 257/40 |
| 5,376,456 | 12/1994 | Cumming et al. | 428/457 |
| 5,408,109 | 4/1995 | Heeger et al. | 257/40 |
| 5,514,870 | 5/1996 | Langenbrunner | 250/367 |
| 5,589,320 | 12/1996 | Ohnishi et al. | 430/321 |
| 5,807,974 | 9/1998 | Kim et al. | 528/690 |

FOREIGN PATENT DOCUMENTS

567396A1  10/1993  European Pat. Off. .
532798A1  12/1995  European Pat. Off. .

OTHER PUBLICATIONS

Fukuda, M, et al. Novel Characteristics of Conducting Poly(9–Alkyfluorene), Poly(9,9–Dialkylfluorene) and Poly(1,10–Bis(9'–Alkylfluorenyl) Alkane), Synthetic Metals, 41–43 (1991) 855–858.

Pei, Q et al., "Efficient Photoluminescence and Electroluminescence from a Soluble Polyfluorene", J. Am. Chem. Soc. 1996, 118, 7416–7417.

Yamamoto, T. et al., "Preparation of Π–Conjugated Poly-(thiophene–2,5–diyl), Poly (p–phenylene), and Related Polymers Using Zerovalent Nickel Complexes. Linear Structure and Properties of the ΠConjugated Polymers". Macromolecules 1992, 25, 1214–1223.

Ohmori, Y. et al., "Blue Electroluminescent Diodes Utilizing Poly(alkylfluorene)", vol. 30, No. 11B, Nov., 1991, pp. L 941–L 1943.

Yang, Y et al., "Efficient Blue–Green and White Light–Emitting Electrochemical Cells Based on Poly[9,9–bis(3,6–Dioxaheptyl)–Fluorene–2,7–Diyl]", J. Appl. Phys. 8(7), Apr. 1, 1997.

Satoh, S. et al., "Optical and Electroluminescence Properties of Poly(Methylphenylsilane) Containing an Anthracene Unit", Synthetic Metals 79 (1996) 97–102.

*Primary Examiner*—Charles Nold
*Attorney, Agent, or Firm*—Robert B. Martin

[57] ABSTRACT

The invention relates to an organic electroluminescent device comprising a light-emitting composition disposed between a first and second electrode. The composition comprises poly(fluorene-co-anthracene).

6 Claims, 1 Drawing Sheet

POLYMERIC LIGHT-EMITTING DEVICE

FIELD OF THE INVENTION

The present invention relates to a light-emitting device, and in particular relates to an organic polymeric electroluminescent device.

BACKGROUND OF THE INVENTION

Inorganic electroluminescent devices are known in the art. The device generally comprises a thin film of phosphor disposed between two electrodes, one of which is transparent. The phosphor generally comprises zinc selenide doped with manganese, europium or terbium. Upon application of a current, the phosphor emits light. Anthracene crystals are also known in the art as an electroluminescent material. However, devices made from these materials require high voltages for operation and have low efficiency.

Organic electroluminescent devices (structure and composition) are also known in the art as disclosed in U.S. Pat. No. 4,356,429 (col. 2–4) and 5,408,109 (col. 5–7), the disclosures of which are incorporated herein by reference for all purposes. There is a desire in the industry to develop an organic polymeric electroluminescent material which efficiently emits deep blue light without excimer formation. Excimer formation causes an undesired color shift in the emission and generally also a loss of efficiency.

Substituted polyfluorenes are known in the art as electroluminescent materials. Although substituted polyfluorenes emit predominantly blue light, they are deficient because they form excimers with red-shifted emission and often form poor films, and can be intractable polymers.

Anthracene dispersed in a polymeric binder is also known in the art as an electroluminescent material. However, these materials are deficient because, as a guest/host system, they aggregate and crystallize, lowering luminous efficiency. These materials also require high voltages to operate. Main chain anthracene homopolymer is intractable and unsuitable. Further, Yamamoto et al. report the inability to make main chain copolymers of anthracene in *Macromolecules,* Vol. 25, 1992, page 1214.

It is therefore an object of the present invention to provide an improved electroluminescent device.

Other objects and advantages will become apparent from the following disclosure.

SUMMARY OF THE INVENTION

The present invention relates to a light-emitting device comprising a light-emitting composition disposed between a first and second electrode. The composition preferably comprises a copolymer formed from anthracene and alkyl-substituted fluorene. The composition emits a deep blue light with high quantum efficiency and without color shifting.

A more thorough disclosure of the present invention is presented in the detailed description which follows and from the drawing.

DETAILED DESCRIPTION OF THE INVENTION

Figure 1:
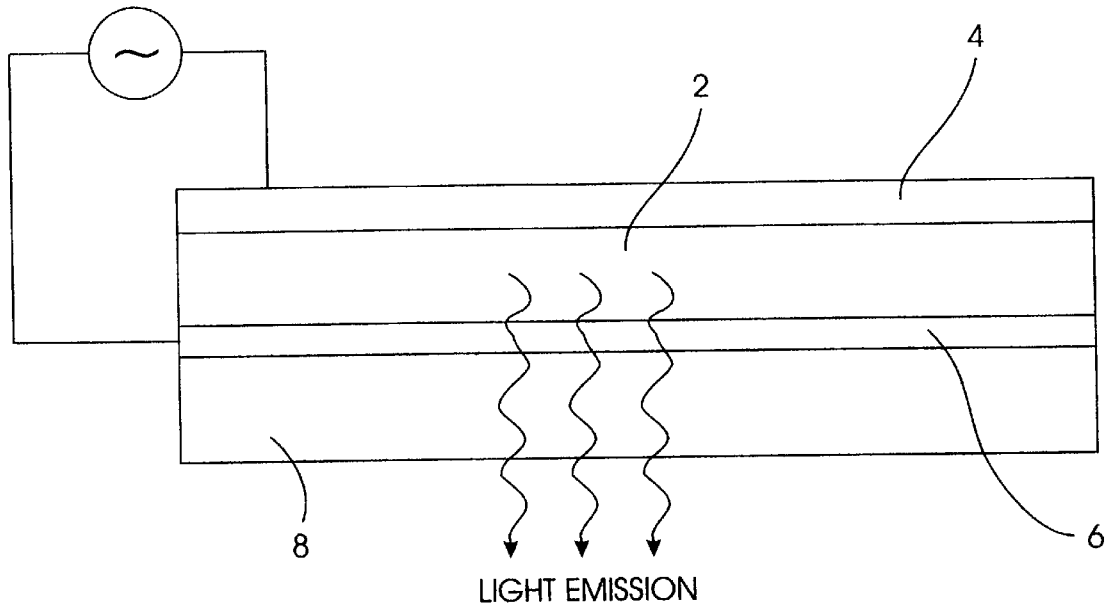
FIG. 1 is a cross-sectional view of an embodiment of the light-emitting device of the present invention.

The present invention relates to a light-emitting device comprising a light-emitting composition disposed between a first and second electrode.

Referring to FIG. 1, there is shown an embodiment of the device comprising the light-emitting composition 2 sandwiched between and contiguous with opaque electrode 4 and transparent electrode 6. The device is supported on a glass base 8. When a voltage is applied to electrodes 4 and 6, light is emitted from composition 2 and radiates from the device through transparent electrode 6 and glass base 8.

The light-emitting composition 2 comprises the copolymer formed from fluorene and anthracene. The polymer preferably has an arylene main chain where the main chain (backbone) of the polymer comprises only aromatic groups bonded directly together without interruption by spacers (e.g., alkylene or silylene spacers). The fluorene monomer is optionally substituted with one or more substituents such as phenyl, benzyl, phenoxy, benzyloxy or lower ($C_{1-10}$) alkyl or alkoxy, suitably ($C_{4-10}$) preferably ($C_{1-7}$), preferably at the 9 position, e.g., 9,9 di ($C_{4-10}$ alkyl) fluorene and 9,9 diphenylfluorene. Other suitable substituents will be known to those skilled in the art. A suitable fluorene reactant is 2,7 dihalo-9,9,dihexylfluorene. The anthracene is also optionally substituted with one or more of the substituents listed above. Suitable anthracene reactants are 9,10 or 2,6 dihaloanthracene or dihalodiphenylanthracene.

Optionally, the fluorene and anthracene can be copolymerized with one or more other suitable comonomers to enhance polymer properties such as hole and electron transport, spectral tuning, and mechanical and thermal properties, e.g., glass transition temperature and film forming property. Suitable comonomers can be monofunctional (end capping) or difunctional. Suitable comonomers for lowering the operating voltage and spectral tuning include triarylamines, arylsulfones, and arylethers. Suitable triarylamines are triphenylamine, diphenyltolyl amine, tetraphenyl-p-phenylene diamine, tetraphenylbenzadine, and aryl amines containing polynuclear aromatic and/or heteraromatic substituents. Suitable hole-transporting monomers include diarylamines e.g., N-substituted carbazoles and amino benzaldehyde hydrazones.

Comonomers which are electron deficient can be used to facilitate electron injection and transport and provide color tuning. Suitable electron-deficient monomers include aryl e.g., (diaryl) sulfones (e.g., biphenyl sulfone), aryl sulfoxide, fluorinated aryls (e.g., bis(diphenylhexafluoro propane), and (octafluorobiphenyl), biphenyls, diaryl phosphine oxides, benzophenones, and electron-deficient heterocyclic compounds (e.g., 2,5 diaryl oxadiazoles, pyridines, quinolines and pyrimidines). Other suitable comonomers will be known to those skilled in the art.

The copolymer of fluorene and anthracene will suitably comprise about 5 to about 95 mole % of the fluorene monomer, preferably about 40 to 65 mole %, and the remainder anthracene. The copolymers with more than two monomers will generally comprise about 40 to 80 mole % of the fluorene monomer, about 5 to 20 mole % of the anthracene, and the remainder the additonal monomer(s). The copolymer of the present invention can be conveniently synthesized by dehalogenation polycondensation with zero valent nickel complexes. The copolymers will suitably have a molecular weight Mn of about 5000 to 100,000.

The light-emitting composition of the present invention may also suitably comprise a salt dispersed in the polymeric composition, preferably an organic salt. Suitable organic salts contain as cations alkali metal ions ($Li^+$, $Na^+$, $K^+$, $Rb^+$), tetraalkyl, aryl, or hetero aryl quaternary ammonium ions including tetra $C_{1-6}$ alkyl ammonium, and as anions tetrafluoroborate, tetraphenylborate, and trifluoromethyl sulfonate. Other suitable organic salts will be known to those skilled in the art.

The electrodes 4 and 6 of the device comprise a conductive material. Suitable opaque electrodes can comprise gold, aluminum, copper, silver, or alloys thereof or a low work function metal such as calcium, aluminum, or alloys of magnesium/silver or lithium/aluminum. Suitable transparent electrodes comprise indium tin oxide, polyaniline, or polythiophene. Other suitable electrodes will be known to those skilled in the art.

In an alternative embodiment, the light-emitting device can comprise a multilayered organic structure (e.g., two or three layers) with an organic hole-injecting and/or transporting material contiguous to the anode and/or, an organic electron-injecting and/or transporting material adjacent to the cathode and the poly(anthracene-co-fluorene) disposed therebetween.

The device of the present invention can be used in flat-panel displays, as a backlight for liquid crystal displays, head-mounted displays, and in segmented instrument displays.

The device of the present invention is conveniently fabricated in a two-step process. The first step involves disposing the composition on the first electrode. Suitably, the composition can be dissolved in a suitable art-known solvent such as xylene, mesitylene, anisole, 1,3 dimethoxybenzene, or mixtures thereof and applied as a thin film to the surface of one of the electrodes. In the second step, the film is dried to a thickness of about 0.01 to 5 microns, and the second electrode is formed (e.g., vapor deposition) or positioned on the backside of the film.

The light-emitting composition of the present invention has a good dynamic response time; excellent film-forming properties (e.g., thin films without pinholes, bubbles or crystallinity); deep blue emission (e.g., preferably within the region defined by the coordinates of the CIE 1931 Chromaticity Diagram (x, y)=(0.08, 0.15) (0.22, 0.25) (0.22, 0.08) and (0.15, 0.05) where preferably x<0.15; y<0.15; no color shifting caused by excimer formation; and excellent quantum efficiency (e.g., >0.5%).

The following examples are a detailed description of certain compositions of the present invention. The detailed description falls within the scope of, and serves to exemplify, the more generally described compositions set forth above. The examples are presented for illustrative purposes only and are not intended as a restriction on the scope of the invention.

EXAMPLE 1

Poly (dihexylfluorene-co-anthracene) (85/15)

A Schlenk tube containing 700 mg (0.00254 mol) bis(1, 5-cyclooctadiene) nickel (0), 450 mg (0.0029 mol) 2,2'bipyridyl, 0.2 mL 1,5 cyclooctadiene, 4 mL of dry DMF, and 8 mL of dry toluene was heated under Argon to 80° C. for 0.5 hour. 627 mg (0.001275 mol) of 2,7-dibromo-9,9-di-n-hexylfluorene and 76 mg (0.000225 mol) 9,10-dibromoanthracene dissolved in 6 mL of degassed toluene were added under Argon to the dark blue reaction mixture. Upon adding the monomers, the color turned to red/brown and the viscosity rose. After maintaining the polymerization for 2 days in the dark, 55 mg (0.000225 mol) 0f 2-bromofluorene dissolved in 1 mL toluene was added and the reaction mixture was stirred for an additional 24 hours to initiate end-capping. The hot polymer solution was then precipitated in a solution of 150 mL concentrated HCL, 150 mL methanol, and 150 mL acetone. After isolating the crude product via filtration, the oligomers were reprecipitated from a chloroform solution into a mixture of acetone/methanol for further purification.

Yield: 388 mg (89%)

$M_n$ (Daltons)=25,200

EXAMPLE 2

Poly (dihexyl fluorene-co-anthracene-co-diphenylsulfone) (80/10/10)

A Schlenk tube containing 700 mg (0.00254 mol) bis(1, 5-cyclooctadiene) nickel (0), 450 mg (0.0029 mol) 2,2'-bipyridyl, 0.2 mL 1,5 cyclooctadiene, 4 mL of dry DMF, and 8 mL of dry toluene was heated under Argon to 80° C. for 0.5 hour. 590 mg (0.0012 mol) of 2,7-dibromo-9,9-di-n-hexylfluorene, 51 mg (0.00015 mol) 9,10-dibromoanthracene, and 56 mg (0.00015 mol) 4,4'-dibromodiphenylsulfone dissolved in 6 mL of degassed toluene were added under Argon to the dark blue reaction mixture. Upon adding the monomers, the color turned to red/brown and the viscosity rose. After maintaining the polymerization for 2 days in the dark, 55 mg (0.000225 mol) 0f 2-bromofluorene dissolved in 1 mL dry toluene was added and the reaction mixture was stirred for an additional 24 hours. The hot polymer solution was then precipitated in a solution of 150 mL concentrated HCL, 150 mL methanol, and 150 mL acetone. After isolating the crude product via filtration, the oligomers were reprecipitated from a chloroform solution into a mixture of acetone/methanol for further purification.

Yield: 343 mg (75%)

$M_n$(Daltons)=37,100

EXAMPLE 3

Poly (dihexylfluorene-co-anthracene-co-diphenylsulfone-co-triphenylamine) (70/10/10/10)

A Schlenk tube containing 700 mg (0.00254 mol) bis(1, 5-cyclooctadiene) nickel (0), 450 mg (0.0029 mol) 2,2'-bipyridyl, 0.2 mL 1,5 cyclooctadiene, 4 mL of dry DMF, and 8 mL of dry toluene was heated under Argon to 80° C. for 0.5 hour. 517 mg (0.00105 mol) of 2,7-dibromo-9,9-di-n-hexylfuorene, 51 mg (0.00015 mol) 9,10-dibromoanthracene, 56 mg (0.00015 mol) 4,4'-dibromodiphenylsulfone, and 63 mg (0.00015 mol) 4,4'-dibromotriphenylamine dissolved in 6 mL of degassed toluene were added under Argon to the dark blue reaction mixture. Upon adding the monomers, the color turned red/brown and the viscosity rose. After maintaining the polymerization for 2 days in the dark, 55 mg (0.000225 mol) of 2-bromofluorene dissolved in 1 mL dry toluene was added and the reaction mixture was stirred for an additional 24 hours. The hot polymer solution was then precipitated in a solution of 150 mL concentrated HCL, 150 mL methanol, and 150 mL acetone. After isolating the crude product via filtration, the oligomers were reprecipitated from a chloroform solution into a mixture of acetone/methanol for further purification.

Yield: 351 mg (78%)

$M_n$(Daltons)=50,400

EXAMPLE 4

The polymer light-emitting diode (PLED) was fabricated on a 7059 glass substrate from Corning Glass Co. 150 nm of patterned ITO was deposited onto the substrate by sputtering from an indium-tin alloy target in the presence of $N_2O$. A thin layer of polyaniline doped with polystyrenesulfonic acid (PSS) was prepared on top of the ITO by spin casting from a 5% PanAqua® solution. 500 nm of the polymer of Example 1 was deposited on top of the polyaniline layer by spin casting of a 3.5% p-xylene solution. 25 nm of calcium was deposited on top of the polymer film by thermal evaporation. An additional 25 nm of aluminum was deposited on top of the calcium electrode by thermal evaporation. The active area of the device is 3 $mm^2$. The PLED device emitted blue light at voltages above 6 V. At 15 V, it had a current density of 140 $A/m^2$, and a luminance of 30 $cd/m^2$. The external quantum efficiency was 0.12%, and the power efficiency was 0.02%. The blue emission peaked at 479 nm, and had color coordinates of (0.17, 0.25) on the 1931 CIE Chromaticity Diagram.

EXAMPLE 5

A polymer light-emitting diode was fabricated in the same manner as in Example 4, except that the polymer was as in Example 2 with a film thickness of 70 nm. The film was spin coated from a p-xylene solution at a concentration of 3.5%. The device emitted blue light at voltages above 4 V. The blue emission peaked at 460 nm, and had CIE coordinates of (0.15, 0.15). At 7 V, it had a current density of 43 $A/m^2$, and a luminance of 2.2 $cd/m^2$. The external quantum efficiency was 0.05%, and the power efficiency was 0.02%.

EXAMPLE 6

A polymer light-emitting diode was fabricated in the same manner as in Example 4, except that the polymer layer was 125 nm of the polymer of Example 3, which was spin coated from a 3.5% solution in p-xylene. The device emitted greenish-blue light at voltages above 5 V. The emission peaked at 480 nm, and had CIE coordinates of (0.19, 0.31). At 15 V, it had a current density of 226 $A/m^2$, and a luminance of 153 $cd/m^2$. The external quantum efficiency was 0.32%, and the power efficiency was 0.05%.

EXAMPLE 7

The polymer light emitting diode was fabricated in the same manner as in Example 4, except that the polymer layer was 60 nm of the polymer of Example 3, which was spin coated from a 3.5% solution in p-xylene, and an additional 50 nm of 2-(4-Biphenylyl)-5-(4-tert-butylphenyl)-1,3,4-oxadiazole was thermally evaporated on top of the polymer layer before evaporation of the top metal electrodes. The resulting device emits greenish blue light at voltages above 5 V. The emission peaked at 480 nm, and had a CIE coordinates of(0.19, 0.31). At 15 V, it had a current density of 187 $A/M^2$, and a luminance of 140 $cd/m^2$. The external quantum efficiency was 0.4%, and the power efficiency was 0.07%.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A light-emitting device comprising a light-emitting composition disposed between a first and second electrode, the composition comprising a copolymer comprising anthracene, fluorene and a third component selected from triarylamine, diaryl sulfone and carbozole, wherein at least one of the anthracene, fluorene and third component is substituted with one or more ($C_{1-10}$) alkyl or alkoxy or phenyl, phenoxy, benzyl or benzyloxy substituents.

2. The device of claim 1 wherein the triarylamine is triphenylamine.

3. The device of claim 1 wherein the diaryl sulfone is diphenylsulfone.

4. The device of claim 1 wherein the composition also comprises an organic salt.

5. The device of claim 4 wherein the salt is a quaternary ammonium salt.

6. The device of claim 4 wherein the anion of the salt is an organic sulfonate.

* * * * *